United States Patent
Ishida et al.

(10) Patent No.: US 10,615,776 B2
(45) Date of Patent: Apr. 7, 2020

(54) PIEZOELECTRIC THIN FILM RESONATOR, FILTER, AND MULTIPLEXER

(71) Applicant: TAIYO YUDEN CO., LTD., Tokyo (JP)

(72) Inventors: Mamoru Ishida, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 99 days.

(21) Appl. No.: 16/015,557

(22) Filed: Jun. 22, 2018

(65) Prior Publication Data
US 2019/0007029 A1 Jan. 3, 2019

(30) Foreign Application Priority Data
Jul. 3, 2017 (JP) .................................. 2017-130534

(51) Int. Cl.
*H03H 9/70* (2006.01)
*H03H 9/56* (2006.01)
(Continued)

(52) U.S. Cl.
CPC ........ *H03H 9/703* (2013.01); *H03H 9/02015* (2013.01); *H03H 9/02118* (2013.01);
(Continued)

(58) Field of Classification Search
CPC ........... H03H 9/02015; H03H 9/02118; H03H 9/02133; H03H 9/0547; H03H 9/13; H03H 9/173; H03H 9/564; H03H 9/568; H03H 9/582; H03H 9/587; H03H 9/70; H03H 9/703; H03H 3/02; H03H 2003/021
(Continued)

(56) References Cited

U.S. PATENT DOCUMENTS

2005/0264137 A1 12/2005 Taniguchi et al.
2005/0269904 A1* 12/2005 Oka ......................... H03H 3/02
310/324
(Continued)

FOREIGN PATENT DOCUMENTS

JP 2005-347898 A 12/2005
JP 2006-020277 A * 1/2006
(Continued)

*Primary Examiner* — Barbara Summons
(74) *Attorney, Agent, or Firm* — Chen Yoshimura LLP (57) ABSTRACT

A piezoelectric thin film resonator includes: a substrate; a lower electrode located on the substrate through an air gap; a piezoelectric film located so as to have a resonance region where the lower electrode and an upper electrode face each other across the piezoelectric film and having a lower piezoelectric film and an upper piezoelectric film, in an extraction region where the lower electrode is extracted from the resonance region, a lower end of a first end face of the lower piezoelectric film being substantially aligned with or located further out than an outer periphery of the air gap, a second end face of the upper piezoelectric film being inclined, an upper end of the second end face being substantially aligned with or located further in than the outer periphery, the lower piezoelectric film having a substantially uniform film thickness between the first end face and the second end face.

10 Claims, 10 Drawing Sheets

(51) Int. Cl.
  *H03H 9/02* (2006.01)
  *H03H 9/17* (2006.01)
  *H03H 3/02* (2006.01)
(52) U.S. Cl.
  CPC ........ *H03H 9/02133* (2013.01); *H03H 9/173* (2013.01); *H03H 9/564* (2013.01); *H03H 9/568* (2013.01); *H03H 3/02* (2013.01); *H03H 2003/021* (2013.01)
(58) Field of Classification Search
  USPC ........................................ 333/133, 187, 189
  See application file for complete search history.

(56) References Cited

U.S. PATENT DOCUMENTS

| 2007/0057599 | A1 | 3/2007 | Motai et al. |
| 2010/0148636 | A1 | 6/2010 | Nishihara et al. |
| 2013/0038405 | A1 | 2/2013 | Taniguchi et al. |
| 2015/0130560 | A1 | 5/2015 | Yokoyama et al. |
| 2017/0207768 | A1* | 7/2017 | Liu ........................ H03H 9/173 |
| 2017/0257076 | A1* | 9/2017 | Kaneko ............... H01L 41/0475 |
| 2018/0175275 | A1* | 6/2018 | Nishihara .......... H03H 9/02118 |
| 2018/0205360 | A1* | 7/2018 | Han ................... H03H 9/02015 |

FOREIGN PATENT DOCUMENTS

| JP | 2006-050021 A | 2/2006 |
| JP | 2007-074647 A | 3/2007 |
| JP | 2013-038658 A | 2/2013 |
| JP | 2015-095714 A | 5/2015 |
| WO | 2009/011148 A1 | 1/2009 |

* cited by examiner

FIG. 6A
SAMPLE A

FIG. 6B
SAMPLE B

FIG. 6C
SAMPLE C

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2017-130534, filed on Jul. 3, 2017, the entire contents of which are incorporated herein by reference.

FIELD

A certain aspect of the present invention relates to a piezoelectric thin film resonator, a filter, and a multiplexer.

BACKGROUND

Acoustic wave devices having piezoelectric thin film resonators have been used as filters and duplexers of wireless devices such as, for example, mobile phones. The piezoelectric thin film resonator has a multilayered structure in which a lower electrode and an upper electrode face each other across a piezoelectric film. The region where the lower electrode and the upper electrode face each other across the piezoelectric film is a resonance region. An air gap reflecting the acoustic wave is formed under the lower electrode in the resonance region as disclosed in, for example, Japanese Laid-open Patent Publication Nos. 2013-038658, 2005-347898, and 2015-095714 (hereinafter, referred to as Patent Documents 1 through 3, respectively). There has been known a structure in which the piezoelectric film has a lower piezoelectric film and an upper piezoelectric film and the outer periphery of the lower piezoelectric film is located further out than the outer periphery of the upper piezoelectric film as disclosed in, for example, Patent Document 1.

SUMMARY OF THE INVENTION

According to a first aspect of the present invention, there is provided a piezoelectric thin film resonator including: a substrate; a lower electrode that is located on the substrate through an air gap; an upper electrode located on the lower electrode; a piezoelectric film that is located so as to have a resonance region where the lower electrode and the upper electrode face each other across at least a part of the piezoelectric film, and has a lower piezoelectric film located on the lower electrode and an upper piezoelectric film located between the lower piezoelectric film and the upper electrode, in an extraction region where the lower electrode is extracted from the resonance region, a lower end of a first end face of the lower piezoelectric film being substantially aligned with or located further out than an outer periphery of the air gap, a second end face of the upper piezoelectric film being inclined so that the upper piezoelectric film widens at smaller distances to the lower electrode, an upper end of the second end face being substantially aligned with or located further in than the outer periphery of the air gap, the lower piezoelectric film having a region having a substantially uniform film thickness between an upper end of the first end face and a lower end of the second end face.

According to a second aspect of the present invention, there is provided a filter including the above piezoelectric thin film resonator.

According to a third aspect of the present invention, there is provided a multiplexer including the above filter.

DESCRIPTION OF EMBODIMENTS

In Patent Document 1, the strength of the multilayered film is enhanced by making the outer periphery of the lower piezoelectric film located further out than the outer periphery of the air gap to reduce deterioration such as breakage of the multilayered film. However, for example, when the multilayered film is thinned to make the resonant frequency high, the strength of the multilayered film is not sufficient even with the structure of Patent Document 1.

Hereinafter, with reference to the accompanying drawings, embodiments of the present invention will be described.

First Embodiment

Figure 1A:
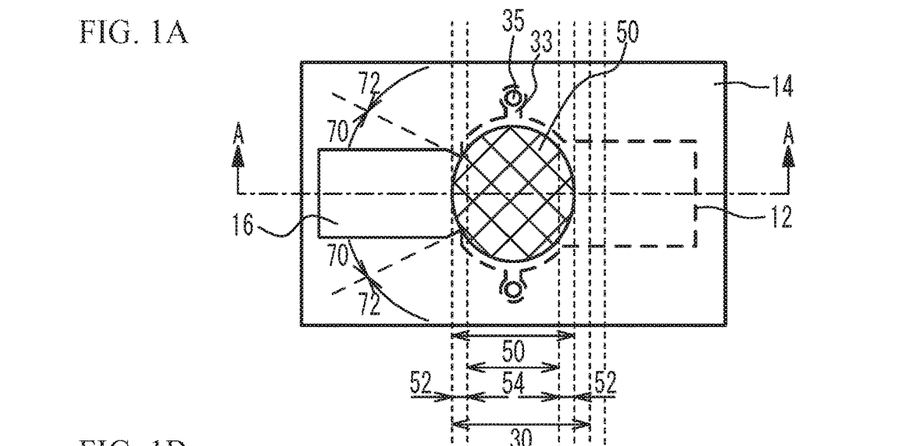
FIG. 1A is a plan view of a piezoelectric thin film resonator in accordance with a first embodiment.
Figure 1B:
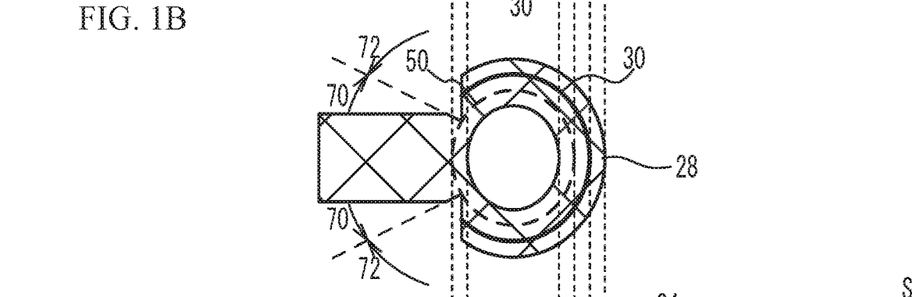
FIG. 1B is a plan view of an insertion film and an air gap.
Figure 1C:
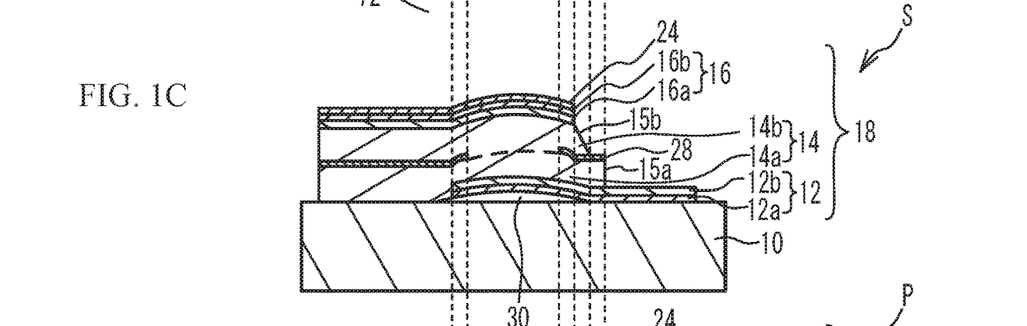
FIG. 1C and FIG. 1D are cross-sectional views taken along line A-A in FIG. 1A.
Figure 1D:
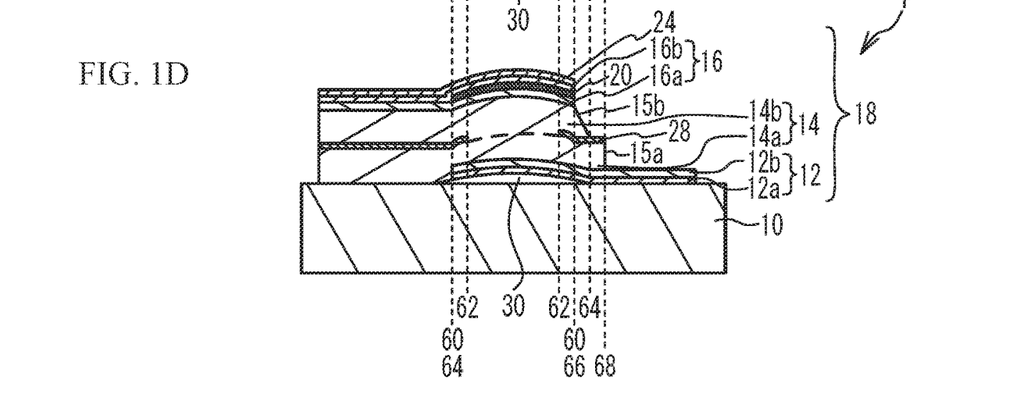

FIG. 1A is a plan view of a piezoelectric thin film resonator in accordance with a first embodiment, FIG. 1B is a plan view of an insertion film and an air gap, and FIG. 1C and FIG. 1D are cross-sectional views taken along line A-A in FIG. 1A. FIG. 1C illustrates, for example, a series resonator of a ladder-type filter, and FIG. 1D illustrates, for example, a parallel resonator of the ladder-type filter.

With reference to FIG. 1A and FIG. 1C, the structure of a series resonator S will be described. A lower electrode 12 is located on a substrate 10 that is a silicon (Si) substrate. An air gap 30 having a dome-shaped bulge is formed between the flat principal surface of the substrate 10 and the lower electrode 12. The dome-shaped bulge is a bulge having a shape in which the height of the air gap 30 is low in the periphery of the air gap 30 and increases at smaller distances to the center of the air gap 30, for example. The lower electrode 12 includes a lower layer 12a and an upper layer 12b. The lower layer 12a is, for example, a chrome (Cr) film, and the upper layer 12b is, for example, a ruthenium (Ru) film.

Located on the lower electrode 12 is a piezoelectric film 14 mainly composed of aluminum nitride (AlN) having the main axis in the (002) direction. The piezoelectric film 14 includes a lower piezoelectric film 14a and an upper piezoelectric film 14b. The lower piezoelectric film 14a is located on the lower electrode 12, and the upper piezoelectric film 14b is located between the lower piezoelectric film 14a and an upper electrode 16. An insertion film 28 is located between the lower piezoelectric film 14a and the upper piezoelectric film 14b.

As illustrated in FIG. 1B, the insertion film 28 is located in an outer peripheral region 52 within the resonance region 50, and is not located in a center region 54. The outer peripheral region 52 is a region within the resonance region 50, includes the outer periphery of the resonance region 50, and is located along the outer periphery. The outer peripheral region 52 has, for example, a ring shape. The center region 54 is a region within the resonance region 50 and includes the center of the resonance region 50. The center may not be necessarily a geometric center.

The upper electrode 16 is located on the piezoelectric film 14 so as to have a region (a resonance region 50) where the upper electrode 16 faces the lower electrode 12 across the piezoelectric film 14. The resonance region 50 has an elliptical shape, and is a region where the acoustic wave in the thickness extension mode resonates. The upper electrode 16 includes a lower layer 16a and an upper layer 16b. The lower layer 16a is, for example, a Ru film, and the upper layer 16b is, for example, a Cr film.

A silicon oxide film is formed as a frequency adjusting film 24 on the upper electrode 16. A multilayered film 18 in the resonance region 50 includes the lower electrode 12, the piezoelectric film 14, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the tip of the introduction path 33 is not covered with the piezoelectric film 14, and the lower electrode 12 has a hole portion 35 at the end of the introduction path 33.

With reference to FIG. 1D, the structure of a parallel resonator P will be described. The parallel resonator P differs from the series resonator S in that a mass load film 20 made of a titanium (Ti) layer is located between the lower layer 16a and the upper layer 16b of the upper electrode 16. Thus, the multilayered film 18 includes the mass load film 20 formed across the entire surface in the resonance region 50 in addition to the multilayered film of the series resonator S. Other structures are the same as those of the series resonator S illustrated in FIG. 1C, and the description thereof is thus omitted.

The difference in resonant frequency between the series resonator S and the parallel resonator P is adjusted with the film thickness of the mass load film 20. The resonant frequency of each of the series resonator S and the parallel resonator P is adjusted by adjusting the film thickness of the frequency adjusting film 24.

When having a resonant frequency of 2 GHz, the piezoelectric thin film resonator is configured as follows. The lower layer 12a of the lower electrode 12 is a Cr film with a film thickness of 100 nm, and the upper layer 12b is an Ru film with a film thickness of 250 nm. The piezoelectric film 14 is an AlN film with a film thickness of 1100 nm. The insertion film 28 is a silicon oxide (SiO$_2$) film with a film thickness of 150 nm. The insertion film 28 is located in the middle in the film thickness direction of the piezoelectric film 14. The lower layer 16a of the upper electrode 16 is a Ru film with a film thickness of 250 nm, and the upper layer 16b is a Cr film with a film thickness of 50 nm. The frequency adjusting film 24 is a silicon oxide film with a film thickness of 50 nm. The mass load film 20 is a Ti film with a film thickness of 120 nm. The film thickness of each layer is appropriately set to achieve a desired resonance characteristic.

The substrate 10 may be a quartz substrate, a glass substrate, a ceramic substrate, or a GaAs substrate instead of an Si substrate. The lower electrode 12 and the upper electrode 16 may be formed of a single-layer film of aluminum (Al), Ti, copper (Cu), molybdenum (Mo), tungsten (W), tantalum (Ta), platinum (Pt), rhodium (Rh) or iridium (Jr) or a multilayered film of at least two of them instead of Ru and Cr. For example, the lower layer 16a of the upper electrode 16 may be made of Ru, and the upper layer 16b may be made of Mo.

The piezoelectric film 14 may be made of zinc oxide (ZnO), lead zirconate titanate (PZT), or lead titanate (PbTiO$_3$) instead of aluminum nitride. Alternatively, for example, the piezoelectric film 14 may be mainly composed of aluminum nitride and contain another element for improving the resonance characteristic or the piezoelectricity. For example, the use of scandium (Sc), a Group II or Group XII element and a Group IV element, or a Group II or Group XII element and a Group V element as additive elements improves the piezoelectricity of the piezoelectric film 14. Thus, the effective electromechanical coupling coefficient of the piezoelectric thin film resonator is improved. The Group II element is, for example, calcium (Ca), magnesium (Mg), or strontium (Sr). The Group XII element is, for example, zinc (Zn). The Group IV element is, for example, Ti, zirconium (Zr), or hafnium (Hf). The Group V element is, for example, Ta, niobium (Nb), or vanadium (V). Yet alternatively, the piezoelectric film 14 may be mainly composed of aluminum nitride and contain boron (B).

The Young's modulus of the insertion film 28 is preferably less than that of the piezoelectric film 14. Since Young's modulus correlates with acoustic impedance when the density is substantially the same, the acoustic impedance of the insertion film 28 is preferably less than that of the piezoelectric film 14. This configuration further improves the Q-value. Furthermore, to make the acoustic impedance of the insertion film 28 less than that of the piezoelectric film 14, the insertion film 28 is preferably an Al film, an Au film, a Cu film, a Ti film, a Pt film, a Ta film, a Cr film, or a silicon oxide film when the piezoelectric film 14 is mainly composed of aluminum nitride.

The frequency adjusting film 24 may be a silicon nitride film or an aluminum nitride film instead of a silicon oxide film. The mass load film 20 may be a single-layer film of Ru, Cr, Al, Cu, Mo, W, Ta, Pt, Rh, or Jr instead of Ti. Alternatively, the mass load film 20 may be an insulating film made of, for example, metal nitride such as silicon nitride or metal oxide such as silicon oxide. The mass load film 20 may be located under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower layer 16a and the upper layer 16b). The mass load film 20 may be larger than the resonance region 50 as long as the mass load film 20 is formed so as to include the resonance region 50.

Figure 2:
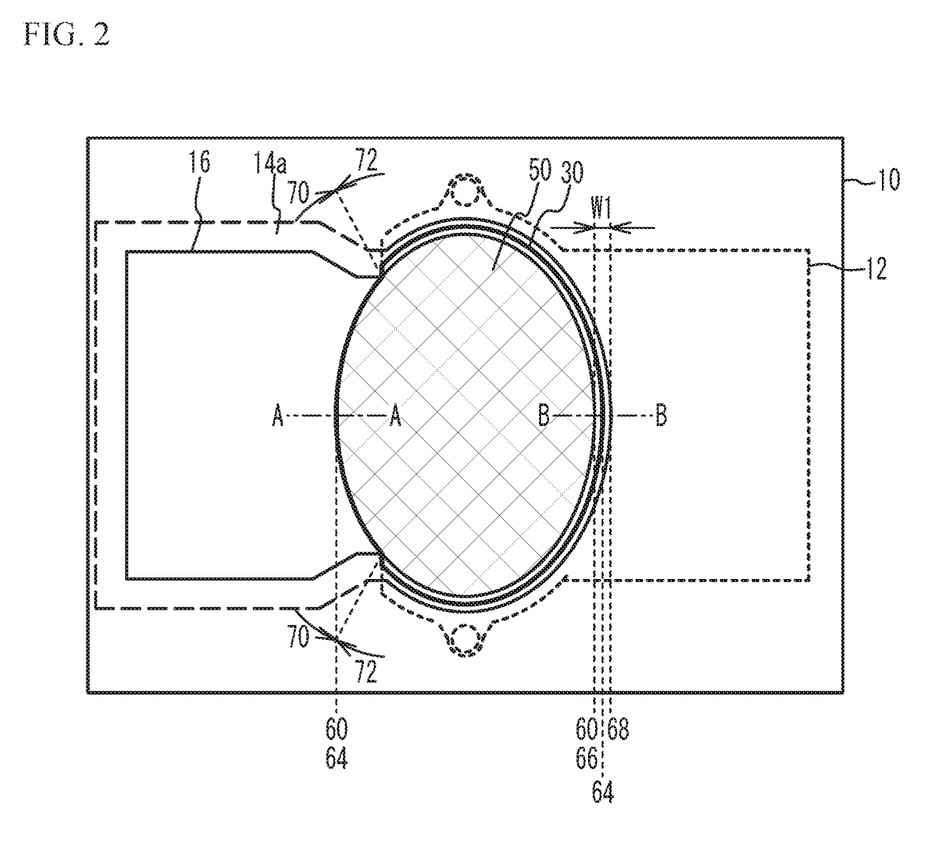
FIG. 2 is a plan view illustrating a positional relationship among a resonance region, the air gap, a lower electrode, an upper electrode, and a piezoelectric film near the resonance region of the piezoelectric thin film resonator of the first embodiment.
Figure 3A:
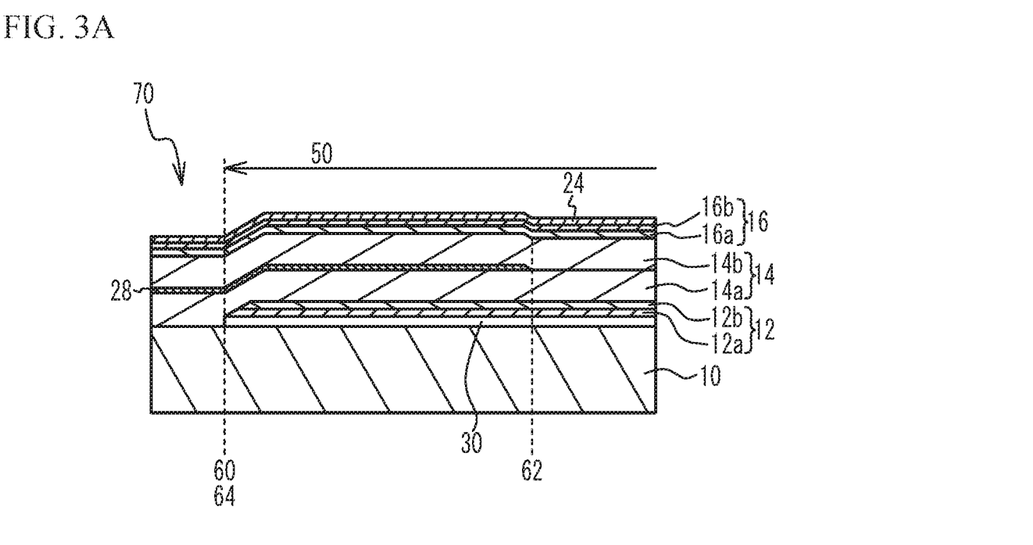
FIG. 3A is a cross-sectional view taken along line A-A in FIG. 2.

FIG. 2 is a plan view illustrating a positional relationship among the resonance region, the air gap, the lower electrode, the upper electrode, and the piezoelectric film near the resonance region of the piezoelectric thin film resonator of the first embodiment. FIG. 3A is a cross-sectional view taken along line A-A in FIG. 2, and FIG. 3B is a cross-sectional view taken along line B-B in FIG. 2.

FIG. 1A through FIG. 3B illustrate an outer periphery 60, which is the outer outline of the resonance region 50, an inner periphery 62, which is the inner outline of the insertion film 28, an outer periphery 64 of the air gap 30, an upper end 66 of an end face 15b of the upper piezoelectric film 14b, and a lower end 68 of an end face 15a of the lower piezoelectric film 14a. In the region surrounding the resonance region 50, an extraction region 70 where the upper electrode 16 is extracted from the resonance region 50 and an extraction region 72 where the lower electrode 12 is extracted from the resonance region 50 are illustrated.

The description "one is substantially aligned with another" means that one is aligned with another to the extent of, for example, the variability in fabrication processes or the alignment precision in fabrication processes.

Figure 3B:
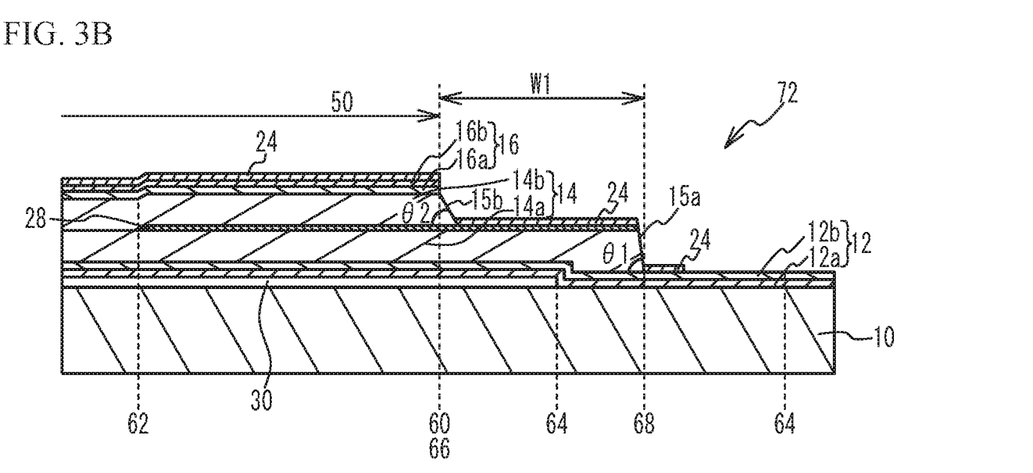
FIG. 3B is a cross-sectional view taken along line B-B in FIG. 2.

As illustrated in FIG. 2 through FIG. 3B, in the extraction region 70, the outer periphery of the lower electrode 12 defines the outer periphery 60 of the resonance region 50. In the extraction region 72, the outer periphery of the upper electrode 16 defines the outer periphery 60 of the resonance region 50. In the extraction region 70, the outer periphery 60 of the resonance region 50 is substantially aligned with the outer periphery 64 of the air gap 30. In the extraction region 72, the outer periphery 64 of the air gap 30 is located further out than the outer periphery 60 of the resonance region 50. The inner periphery 62 of the insertion film 28 is located further in than the outer periphery 60 of the resonance region 50.

In the extraction region 72, the end face 15a of the lower piezoelectric film 14a and the end face 15b of the upper piezoelectric film 14b are inclined so that the piezoelectric film 14 widens at smaller distances to the lower electrode 12. The angle (inner angle) between the upper surface of the lower electrode 12 (or the upper surface of the substrate 10) and the end face 15a is θ1, and the angle (inner angle) between the upper surface and the end face 15b of the lower electrode 12 is θ2. The width between the lower end 68 of the end face 15a of the lower piezoelectric film 14a and the upper end 66 of the end face 15b of the upper piezoelectric film 14b is W1.

In plan view, the end face 15a is located further out than the outer periphery 64 of the air gap 30. The end face 15b is located further in than the outer periphery 64 of the air gap 30. The upper end 66 of the end face 15b is substantially aligned with the outer periphery of the upper electrode 16. The frequency adjusting film 24 is located to the outside of the lower end 68 of the end face 15a (see FIG. 3B).

Fabrication Method of the First Embodiment

Figure 4A:
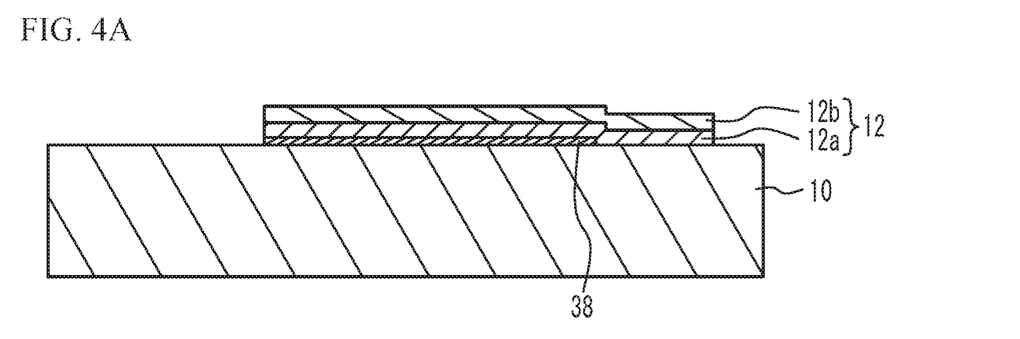
FIG. 4A through FIG. 4C are cross-sectional views (No. 1) illustrating a method of fabricating a series resonator of the first embodiment.

FIG. 4A through FIG. 5B are cross-sectional views illustrating a method of fabricating the series resonator of the first embodiment. As illustrated in FIG. 4A, a sacrifice layer 38 for forming an air gap is formed on the substrate 10 having a flat principal surface. The sacrifice layer 38 has a film thickness of, for example, 10 to 100 nm, and is made of a material such as magnesium oxide (MgO), ZnO, germanium (Ge), or silicon oxide (SiO$_2$), which easily dissolves in an etching liquid or an etching gas. The sacrifice layer 38 is then patterned into a desired shape by photolithography and etching. The shape of the sacrifice layer 38 corresponds to the planar shape of the air gap 30, and includes the region to be, for example, the resonance region 50. Then, the lower layer 12a and the upper layer 12b are formed as the lower electrode 12 on the sacrifice layer 38 and the substrate 10. The sacrifice layer 38 and the lower electrode 12 are formed by, for example, sputtering, vacuum evaporation, or Chemical Vapor Deposition (CVD). The lower electrode 12 is then patterned into a desired shape by photolithography and etching. The lower electrode 12 may be formed by liftoff.

Figure 4B:
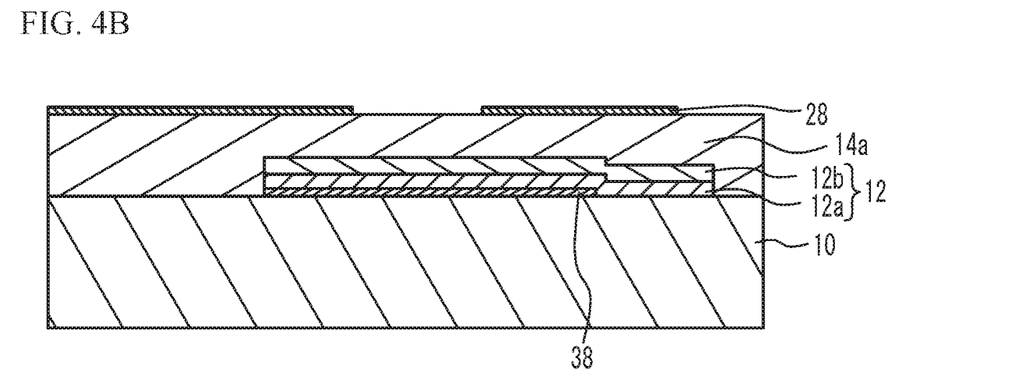

As illustrated in FIG. 4B, the lower piezoelectric film 14a is formed on the lower electrode 12 and the substrate 10 by, for example, sputtering, vacuum evaporation, or CVD. The insertion film 28 is formed on the lower piezoelectric film 14a by, for example, sputtering, vacuum evaporation, or CVD. The insertion film 28 is then patterned into a desired shape by photolithography and etching. The insertion film 28 may be formed by liftoff.

Figure 4C:
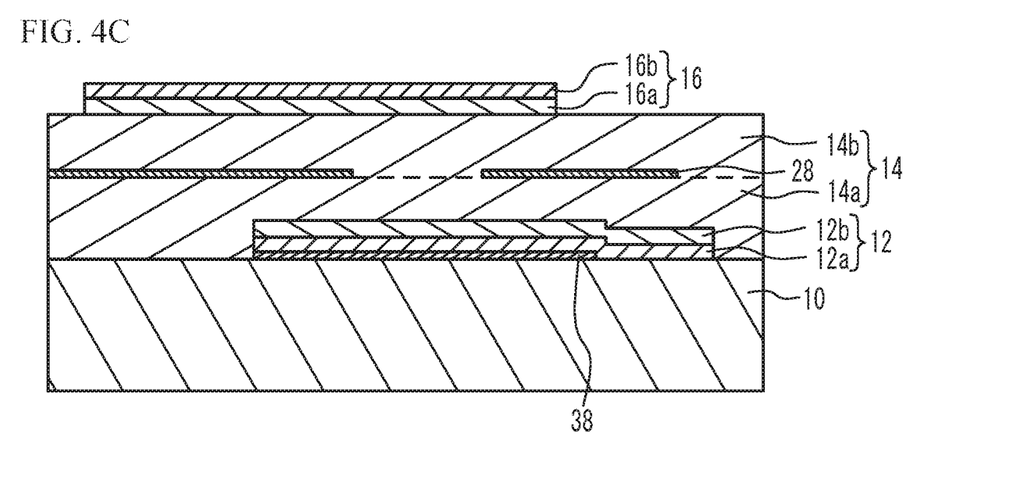

As illustrated in FIG. 4C, the upper piezoelectric film 14b and the lower layer 16a and the upper layer 16b of the upper electrode 16 are formed by, for example, sputtering, vacuum evaporation, or CVD. The lower piezoelectric film 14a and the upper piezoelectric film 14b form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a of the upper electrode 16 is formed, the mass load film 20 is formed by, for example, sputtering, vacuum evaporation, or CVD. The mass load film 20 is patterned into a desired shape by photolithography and etching. Then, the upper layer 16b of the upper electrode 16 is formed. The illustration of the frequency adjusting film is omitted.

Figure 5A:
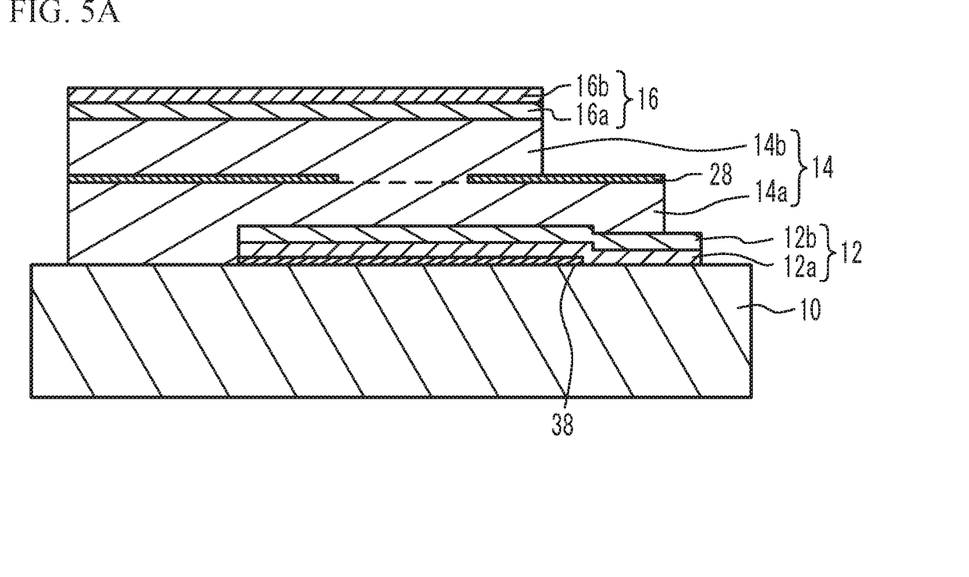
FIG. 5A and FIG. 5B are cross-sectional views (No. 2) illustrating the method of fabricating the series resonator of the first embodiment.

As illustrated in FIG. 5A, the piezoelectric film 14 is patterned into a desired shape by photolithography and etching. Etching may be performed by wet etching or dry etching. Appropriate choice of etching conditions allows the end faces 15a and 15b to be inclined. For example, the end faces 15a and 15b are inclined by wet etching the piezoelectric film 14.

The upper electrode 16 may be used for at least a part of a mask used to etch the upper piezoelectric film 14b. By etching the upper piezoelectric film 14b using the upper electrode 16 as a mask, the upper piezoelectric film 14b and the upper electrode 16 are patterned into the same shape. The insertion film 28 and the upper electrode 16 may be used for at least a part of a mask used to etch the lower piezoelectric film 14a. By etching the lower piezoelectric film 14a using the insertion film 28 as a mask, the outline of the lower piezoelectric film 14a and the outline of the insertion film 28 are substantially aligned with each other.

Figure 5B:
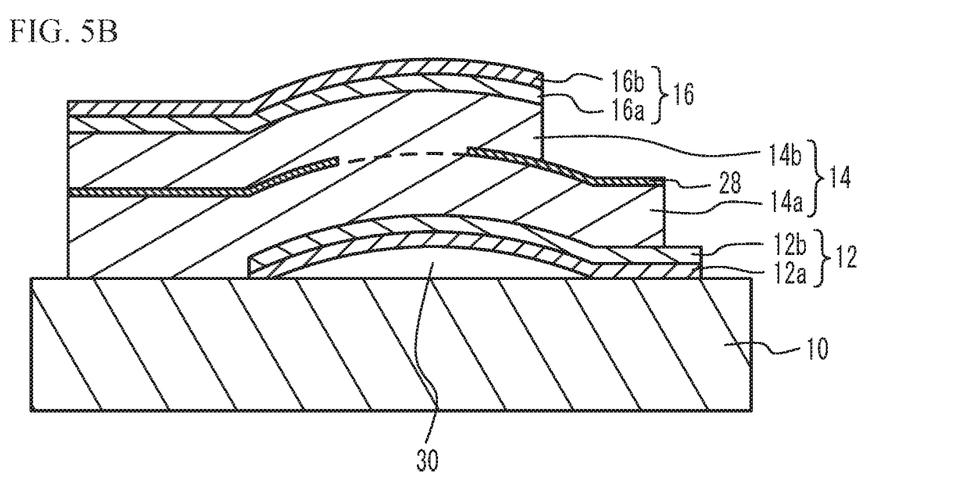

As illustrated in FIG. 5B, an etching liquid for the sacrifice layer 38 is introduced into the sacrifice layer 38 under the lower electrode 12 through the hole portion 35 and the introduction path 33 (see FIG. 1A). This process removes the sacrifice layer 38. A substance for etching the sacrifice layer 38 is preferably a substance that does not etch materials constituting the resonator except the sacrifice layer 38. In particular, a substance used for etching is preferably a substance that does not etch the lower electrode 12 with which the substance comes in contact. The stress of the multilayered film 18 (see FIG. 1C and FIG. 1D) is set so as to be a compression stress. This setting causes the multilayered film 18 to bulge out to the opposite side to the substrate 10 so as to separate from the substrate 10 when the sacrifice layer 38 is removed. The air gap 30 having a dome-shaped bulge is formed between the lower electrode 12 and the substrate 10. The above processes complete the series resonator S illustrated in FIG. 1A and FIG. 1C and the parallel resonator P illustrated in FIG. 1A and FIG. 1D.

Simulation 1

In the piezoelectric thin film resonator, when the resonant frequency is to be increased, the multilayered film 18 becomes thin. Thus, the strength of the multilayered film 18 is reduced. In particular, as described in FIG. 5B, when the stress of the multilayered film 18 is large, the multilayered film 18 easily deteriorates. Thus, for the piezoelectric thin film resonator with a resonant frequency of 5 GHz, the displacement of the lower electrode 12 was simulated.

Figure 6A:
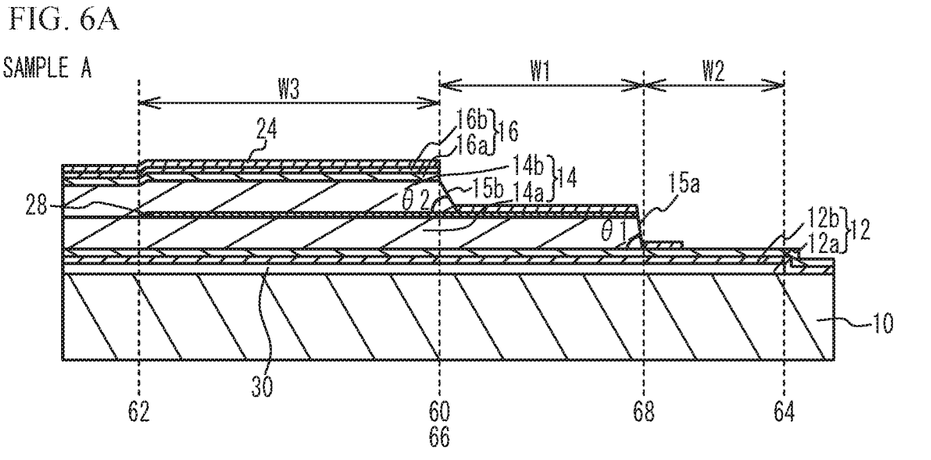
FIG. 6A through FIG. 6C are cross-sectional views of samples A through C corresponding to the cross-section taken along line B-B in FIG. 2, respectively.
Figure 6B:
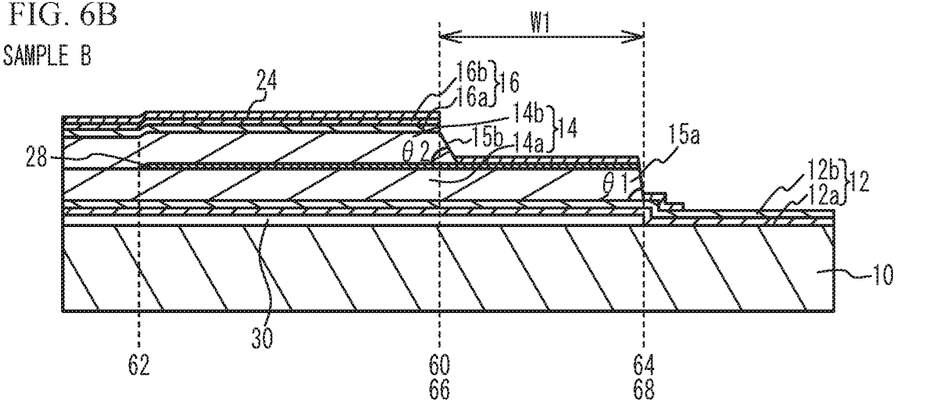
Figure 6C:
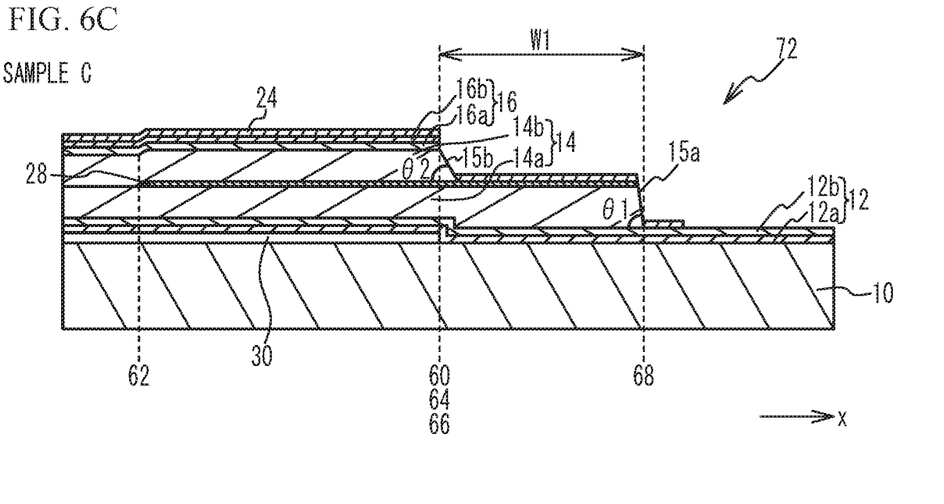

FIG. 6A through FIG. 6C are cross-sectional views of samples A through C corresponding to the cross-section taken along line B-B in FIG. 2, respectively. The sample A corresponds to a first comparative example, and the samples B and C correspond to the first embodiment. The position in the minor axis direction of the resonance region 50 is defined as X. The cross-sections taken along line A-A in FIG. 2 of the samples A through C are the same as that of FIG. 3A.

As illustrated in FIG. 6A, in the sample A, the outer periphery 64 of the air gap 30 is located further out than the lower end 68 of the end face 15a by a width W2. Other structures are the same as those of FIG. 3B, and the description thereof is thus omitted.

As illustrated in FIG. 6B, in the sample B, the lower end 68 of the end face 15a and the outer periphery 64 of the air gap 30 are substantially aligned with each other. Other structures are the same as those illustrated in FIG. 3B, and the description thereof is thus omitted.

As illustrated in FIG. 6C, in the sample C, the upper end 66 of the end face 15b and the outer periphery 64 of the air gap 30 are substantially aligned with each other. Other structures are the same as those illustrated in FIG. 3B, and the description thereof is thus omitted.

Other simulation conditions are as follows.

Lower layer 12a of the lower electrode 12: Cr film with a film thickness of 25 nm Upper layer 12b of the lower electrode 12: Ru film with a film thickness of 80 nm Lower piezoelectric film 14a: AlN film with a film thickness of 245 nm Upper piezoelectric film 14b: AlN film with a film thickness of 245 nm Insertion film 28: Silicon oxide film with a film thickness of 50 nm Lower layer 16a of the upper electrode 16: Ru film with a film thickness of 100 nm Upper layer 16b of the upper electrode 16: Cr film with a film thickness of 15 nm Frequency adjusting film 24: Silicon oxide film with a film thickness of 20 nm     Angle $\theta 1$ of the end face 15a: 70°
    Angle $\theta 2$ of the end face 15b: 50°
    Width W1: 8 µm
    Width W2: 5 µm
    Width of the resonance region 50: 42 µm
    Insertion width W3 of the insertion film 28: 11 µm
    Inner stress of the lower electrode 12: −100 MPa
    Inner stress of the piezoelectric film 14: −500 MPa
    Inner stress of the upper electrode 16: −1000 MPa Negative inner stress means compression stress. In FIG. 5B, the displacement of the lower surface of the lower electrode 12 before and after removal of the sacrifice layer 38 was simulated by the two-dimensional finite element method.

Figure 7A:
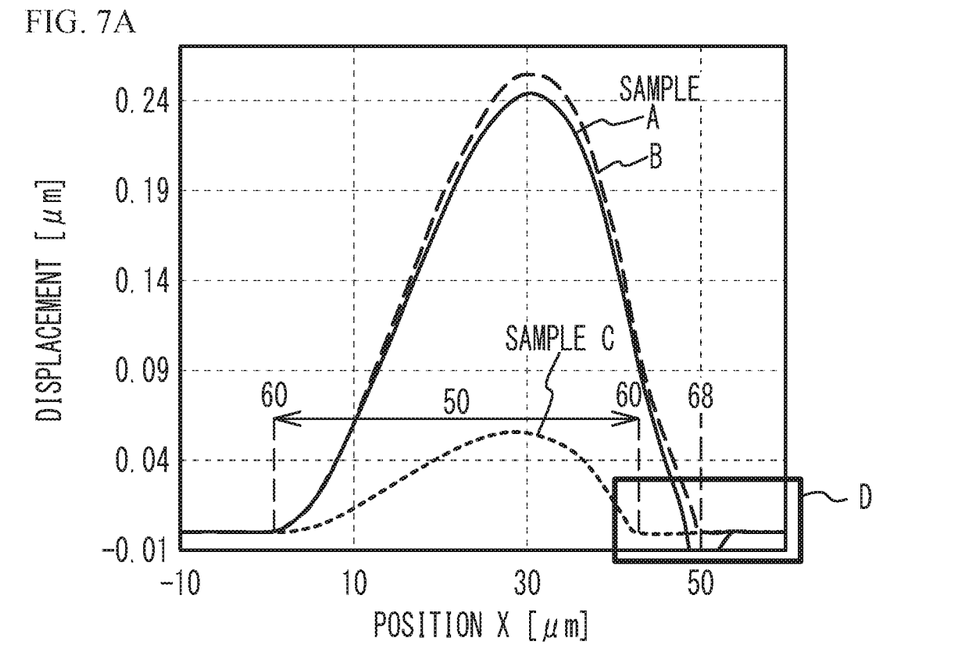
FIG. 7A and FIG. 7B are graphs of a displacement versus a position X in the samples A through C.
Figure 7B:
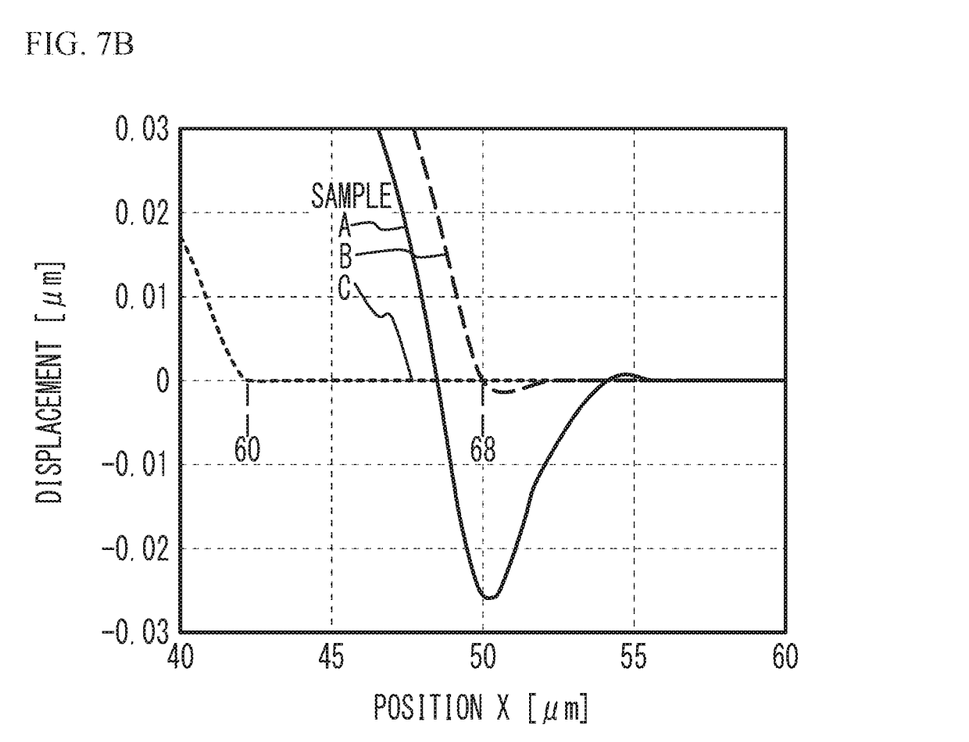

FIG. 7A and FIG. 7B are graphs of a displacement versus a position X in the samples A through C. FIG. 7B is an enlarged view of a region D in FIG. 7A. For the position X, the outer periphery 60 in the extraction region 70 of the upper electrode 16 of the resonance region 50 was defined as 0. The position X of the outer periphery 60 in the extraction region 72 of the lower electrode 12 of the resonance region 50 is thus 42 µm. The position X of the lower end 68 of the end face 15a of the lower piezoelectric film 14a is 50 µm. For the displacement, the lower surface of the lower electrode 12 in the outer periphery 60 in the extraction region 70 of the upper electrode 16 of the resonance region 50 was defined as 0. The displacement when the lower surface of the lower electrode 12 is displaced upward at the time of removal of the sacrifice layer 38 was defined positive.

As illustrated in FIG. 7A, in the samples A and B, the displacement is large near the center of the resonance region 50. In the sample C, the displacement is small.

As illustrated in FIG. 7B, in the sample A, the displacement is negative near the lower end 68 of the end face 15a. As described above, in the sample A, the lower electrode 12 is displaced downward near the end face 15a. For example, if the lower electrode 12 comes in contact with the upper surface of the substrate 10, the multilayered film 18 such as the lower electrode 12 is easily damaged. Additionally, the displacement of the lower electrode 12 rapidly changes from negative to positive near the end face 15a. Thus, the multilayered film 18 is easily damaged.

In the samples B and C, the displacement near the end face 15a is 0 or positive. This reduces deterioration such as breakage of the multilayered film 18. It is considered that deterioration of the multilayered film 18 is reduced when the outer periphery 64 of the air gap 30 is located at least between the samples B and C.

Simulation 2

Next, the stress in the multilayered film 18 was simulated for a sample D having an angle $\theta 2$ of 50° and a sample E having an angle $\theta 2$ of 90°. The angle $\theta 2$ is an angle between the end face 15b and the lower surface of the upper piezoelectric film 14b. The sample D corresponds to the first embodiment, and the sample E corresponds to a second comparative example. The simulation conditions other than the angle $\theta 2$ are the same as those of the simulation 1.

Figure 8A:
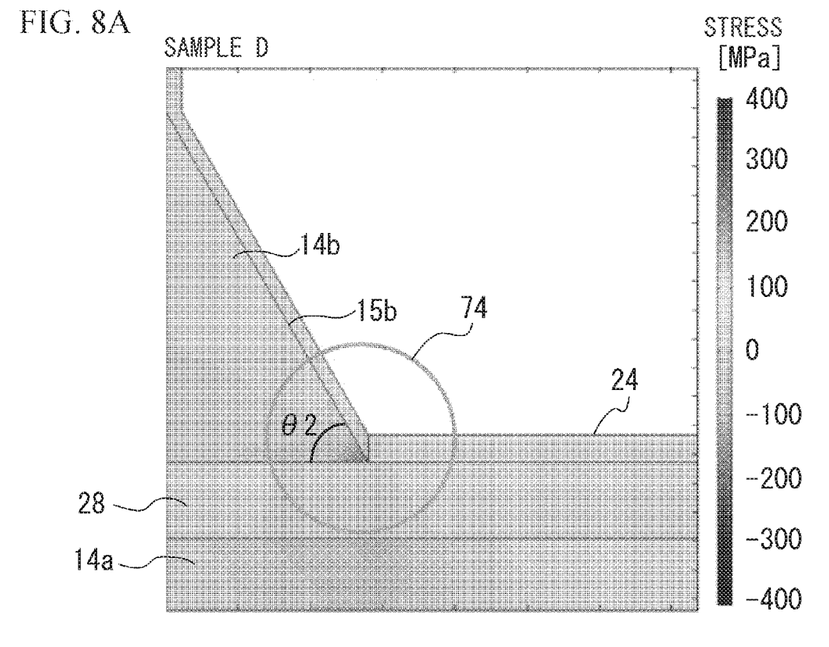
FIG. 8A and FIG. 8B illustrate stresses in samples D and E, respectively.
Figure 8B:
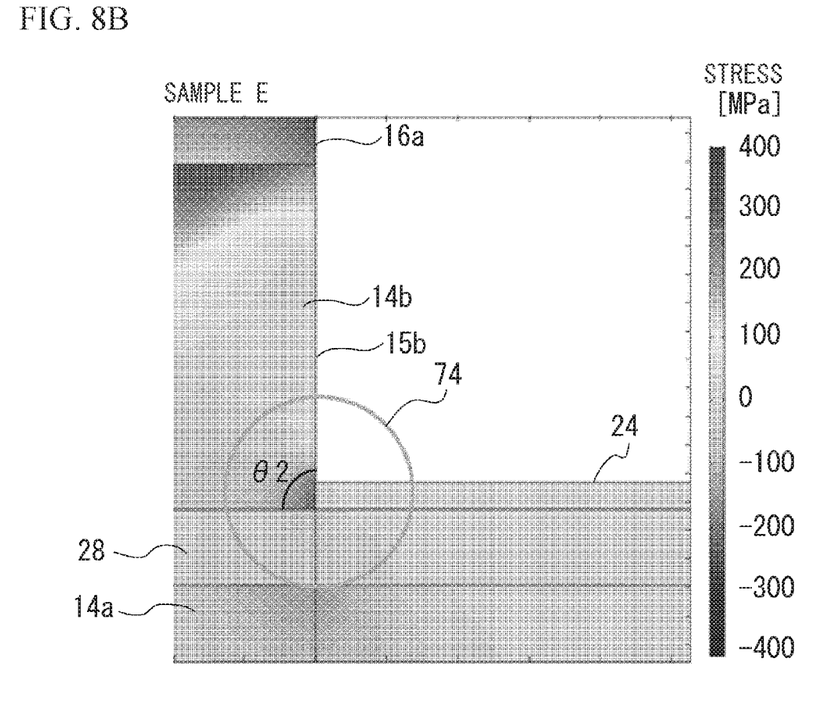

FIG. 8A and FIG. 8B illustrate stresses in the samples D and E, respectively. FIG. 8A and FIG. 8B are enlarged views of the vicinity of the end face 15b. The contrasting density expresses stress, and a darker region means a larger stress. As illustrated in FIG. 8A and FIG. 8B, the sample E has a greater stress than the sample D. The stress of a region 74 near the point where the end face 15b comes in contact with the insertion film 28 is approximately −150 MPa in the sample D and approximately −300 MPa in the sample E. As described above, the stress approximately two times the stress applied to the sample D is applied to the sample E. The region 74 corresponds to the region where the displacement rapidly changes as illustrated in FIG. 7A and FIG. 7B, and the stress that is approximately two times the stress in the sample D causes deterioration of the multilayered film 18 such as peeling of the upper piezoelectric film 14b in the sample E.

Advantage of the First Embodiment

In the first embodiment, in the extraction region 72 of the lower electrode 12, the lower end 68 of the end face 15a (a first end face) of the lower piezoelectric film 14a is substantially aligned with or located further out than the outer periphery 64 of the air gap 30. This structure causes the multilayered film 18 to be displaced toward the substrate 10 as illustrated in FIG. 7A and FIG. 7B, and deterioration of the multilayered film 18 is reduced.

The end face 15b (a second end face) of the upper piezoelectric film 14b is inclined so that the piezoelectric film 14 widens at smaller distances to the lower electrode 12. This structure inhibits the stress concentration to the region where the displacement greatly changes as illustrated in FIG. 8A and FIG. 8B, thereby further reducing deterioration of the multilayered film 18. The angle θ2 between the end face 15b and the lower surface of the upper piezoelectric film 14b is preferably 70° or less, more preferably 60° or less. Additionally, the angle θ2 is preferably 20° or greater, more preferably 30° or greater.

When the outer periphery 64 of the air gap 30 is located further in than the outer periphery 60 of the resonance region 50, the acoustic wave is restrained. Thus, the upper end 66 of the end face 15b, which is substantially aligned with the outer periphery 60 of the resonance region 50, is substantially aligned with or located further in than the outer periphery 64 of the air gap 30.

To reduce deterioration of the multilayered film 18, in addition to the end face 15a of the lower piezoelectric film 14a, it is considered that the end face 15b of the upper piezoelectric film 14b is preferably located further out than the outer periphery 64 of the air gap 30. However, when the end face 15b of the upper piezoelectric film 14b is located further out than the outer periphery 64 of the air gap 30, the acoustic wave in the lateral mode leaks from the resonance region 50 to the substrate through the upper piezoelectric film 14b. Accordingly, the characteristics including the Q-value deteriorate. Thus, the lower piezoelectric film 14a has a region having a substantially uniform film thickness between the upper end of the end face 15a and the lower end of the end face 15b. This structure makes the lateral mode acoustic wave from the resonance region 50 reflected by the end face 15b. Thus, deterioration of characteristics including a Q-value is reduced.

In addition, the lower end 68 of the end face 15a of the lower piezoelectric film 14a is preferably located further out than the outer periphery 64 of the air gap 30. This structure further reduces deterioration such as breakage of the multilayered film 18.

In the extraction region 72, the upper end 66 of the end face 15b is preferably substantially aligned with or located further in than the outer periphery of the upper electrode 16. This structure causes the lateral mode acoustic wave to be reflected near the outer periphery 60 of the resonance region 50, thereby reducing the leak of the acoustic wave to the outside of the resonance region 50. When the lower end of the end face 15b is located further out than the outer periphery 64 of the air gap 30, the acoustic wave may leak from the vicinity of the lower end of the end face 15b. Thus, the lower end of the end face 15b is preferably substantially aligned with or located further in than the outer periphery 64 of the air gap 30. This structure further reduces the leak of the acoustic wave to the outside of the resonance region 50.

In the extraction region 72, the end face 15a is inclined so that the piezoelectric film 14 widens at smaller distances to the lower electrode 12. This structure reduces the stress of the multilayered film 18 near the lower end 68 of the end face 15a. The angle θ1 between the end face 15a and the lower surface of the lower piezoelectric film 14a is preferably 70° or less, more preferably 60° or less. The angle θ1 is preferably 20° or greater, more preferably 30° or greater.

When the center of the upper surface of the air gap 30 bulges upward, the multilayered film 18 is easily displaced, and the multilayered film thus easily deteriorates. Therefore, the end face 15b is preferably inclined as in the first embodiment.

When the total inner stress of the lower electrode 12, the piezoelectric film 14, and the upper electrode 16 is a compression stress, the multilayered film 18 is easily displaced, and the multilayered film thus easily deteriorates. Therefore, the end face 15b is preferably inclined as in the first embodiment. The compression stress may be −100 MPa or less, −500 MPa or less, or −1000 MPa or less.

The insertion film 28 is located between the lower piezoelectric film 14a and the upper piezoelectric film 14b in the outer peripheral region 52 of the resonance region 50, and is not located in the center region 54 of the resonance region 50. This structure causes the lateral mode acoustic wave to be reflected by the inner periphery 62 of the insertion film 28 and the end face 15b. Thus, the characteristics including the Q-value are further improved.

The piezoelectric film 14 is mainly composed of aluminum nitride, and has a film thickness of 1200 nm or less. When the piezoelectric film 14 is thin as described above, the multilayered film 18 easily deteriorates. Thus, as in the first embodiment, the end face 15b is preferably inclined. When the piezoelectric film 14 is mainly composed of aluminum nitride, the piezoelectric film 14 has a film thickness of 1000 nm or less or 700 nm or less to achieve a resonant frequency of 5 GHz. This structure makes the multilayered film 18 easily damaged. Thus, the first embodiment is preferably applied to piezoelectric thin film resonators with a resonant frequency of 3 GHz or greater or 4 GHz or greater.

First Variation of the First Embodiment

Figure 9:
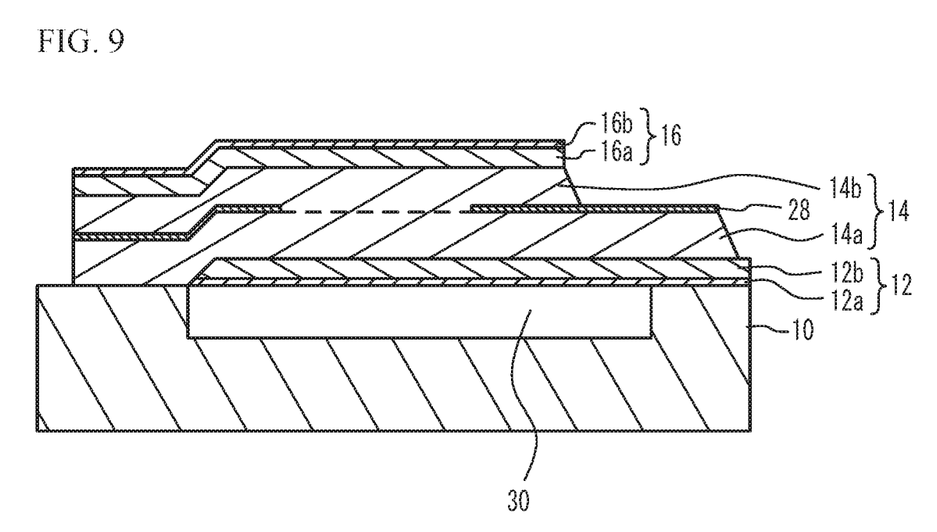
FIG. 9 is a cross-sectional view of a piezoelectric thin film resonator of a first variation of the first embodiment.

A first variation of the first embodiment changes the structure of the air gap. FIG. 9 is a cross-sectional view of a piezoelectric thin film resonator in accordance with the first variation of the first embodiment. As illustrated in FIG. 9, a recessed portion is formed on the upper surface of the substrate 10. The lower electrode 12 is flatly formed on the substrate 10. This structure forms the air gap 30 in the recessed portion of the substrate 10. The air gap 30 is formed so as to include the resonance region 50. Other structures are the same as those of the first embodiment, and the description thereof is thus omitted. The air gap 30 may be formed so as to penetrate through the substrate 10. An insulating film being in contact with the lower surface of the lower electrode 12 may be formed. That is, the air gap 30 may be formed between the substrate 10 and the insulating film being in contact with the lower electrode 12. The insulating film is, for example, an aluminum nitride film.

In the first variation of the first embodiment, since the inner stress of the multilayered film 18 may be small, the multilayered film 18 is less likely to be damaged than in the first embodiment. However, it is impossible to make the inner stress of the multilayered film 18 zero, the multilayered film 18 may be damaged when the multilayered film 18 is thinned. Thus, as in the first embodiment, the end face 15b is preferably inclined.

The first embodiment and the variation thereof have described an example in which in the extraction region 70, the outer periphery 64 of the air gap 30 is substantially aligned with the outer periphery 60 of the resonance region 50, but the outer periphery 64 of the air gap 30 may be located further out than the outer periphery 60 of the resonance region 50.

The insertion film 28 between the lower piezoelectric film 14a and the upper piezoelectric film 14b may be located across the entire of the resonance region 50. The insertion film 28 may not be necessarily located within the resonance region 50, and may be located outside the resonance region 50. The insertion film 28 may not be necessarily provided. The resonance region 50 has an elliptical shape, but may have other shapes. For example, the resonance region 50 has a polygonal shape such as a quadrangle shape or a pentagonal shape.

Second Embodiment

Figure 10A:
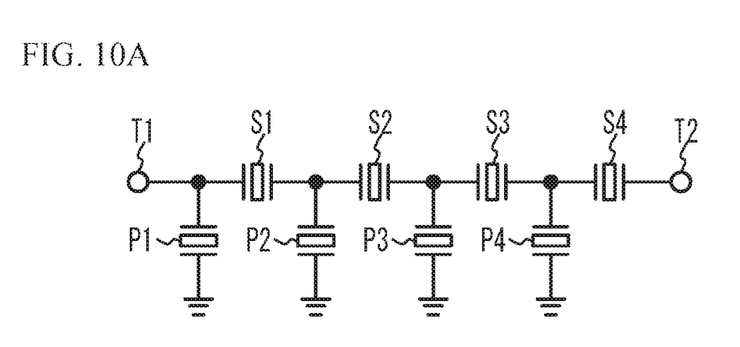
FIG. 10A and FIG. 10B are circuit diagrams of filters in accordance with a second embodiment and a first variation thereof, respectively.

A second embodiment is an exemplary filter and an exemplary duplexer including the piezoelectric thin film resonator according to any one of the first embodiment and the variation thereof. FIG. 10A is a circuit diagram of a filter in accordance with thr second embodiment. As illustrated in FIG. 10A, between an input terminal T1 and an output terminal T2, one or more series resonators S1 through S4 are connected in series. Between the input terminal T1 and the output terminal T2, one or more parallel resonators P1 through P4 are connected in parallel. At least one of the one or more series resonators S1 through S4 and the one or more parallel resonators P1 through P4 may be the acoustic wave resonator according to any one of the first embodiment and the variation thereof. The number of resonators in the ladder-type filter may be freely selected. The filter including the acoustic wave resonator according to any one of the first embodiment and the variation thereof may be a multimode filter instead of the ladder-type filter.

Figure 10B:
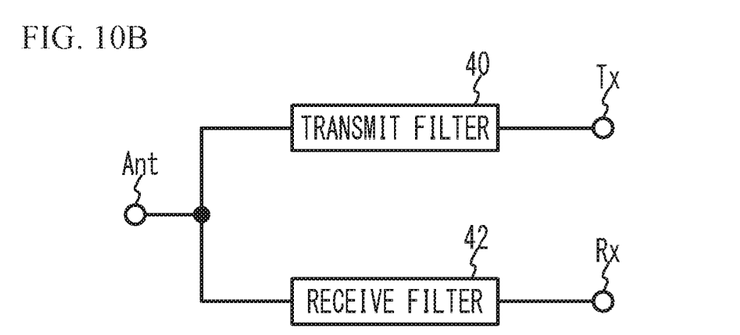

FIG. 10B is a circuit diagram of a duplexer in accordance with a variation of the second embodiment. As illustrated in FIG. 10B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the second embodiment.

A duplexer has been described as an example of the multiplexer, but the multiplexer may be, for example, a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
   a substrate;
   a lower electrode that is located on the substrate through an air gap;
   an upper electrode located on the lower electrode;
   a piezoelectric film that is located so as to have a resonance region where the lower electrode and the upper electrode face each other across at least a part of the piezoelectric film, and has a lower piezoelectric film located on the lower electrode and an upper piezoelectric film located between the lower piezoelectric film and the upper electrode, in an extraction region where the lower electrode is extracted from the resonance region, a lower end of a first end face of the lower piezoelectric film being substantially aligned with or located further out than an outer periphery of the air gap, a second end face of the upper piezoelectric film being inclined so that the upper piezoelectric film widens at smaller distances to the lower electrode, an upper end of the second end face being substantially aligned with or located further in than the outer periphery of the air gap, the lower piezoelectric film having a region having a substantially uniform film thickness between an upper end of the first end face and a lower end of the second end face.

2. The piezoelectric thin film resonator according to claim 1, wherein
   in the extraction region, the lower end of the first end face of the lower piezoelectric film is located further out than the outer periphery of the air gap.

3. The piezoelectric thin film resonator according to claim 1, wherein
   in the extraction region, the upper end of the second end face is substantially aligned with or located further in than an outer periphery of the upper electrode, and
   the lower end of the second end face is substantially aligned with or located further in than the outer periphery of the air gap.

4. The piezoelectric thin film resonator according to claim 1, wherein
   in the extraction region, the first end face is inclined so that the lower piezoelectric film widens at smaller distances to the lower electrode.

5. The piezoelectric thin film resonator according to claim 1, wherein
   an upper surface of the air gap has a center bulging upward.

6. The piezoelectric thin film resonator according to claim 1, wherein
   a total inner stress of the lower electrode, the piezoelectric film, and the upper electrode is a compression stress.

7. The piezoelectric thin film resonator according to claim 1, further comprising:
   an insertion film that is located between the lower piezoelectric film and the upper piezoelectric film in an outer peripheral region of the resonance region, and is not located in a center region of the resonance region.

8. The piezoelectric thin film resonator according to claim 1, wherein
   the piezoelectric film is mainly composed of aluminum nitride, and has a film thickness of 1200 nm or less.

9. A filter comprising:
   a piezoelectric thin film resonator including:
      a substrate;
      a lower electrode that is located on the substrate through an air gap;
      an upper electrode located on the lower electrode;
      a piezoelectric film that is located so as to have a resonance region where the lower electrode and the upper electrode face each other across at least a part of the piezoelectric film, and has a lower piezoelectric film located on the lower electrode and an upper piezoelectric film located between the lower piezoelectric film and the upper electrode, in an extraction region where the lower electrode is extracted from the resonance region, a lower end of a first end face of the lower piezoelectric film being substantially aligned with or located further out than an outer periphery of the air gap, a second end face of the upper piezoelectric film being inclined so that the upper piezoelectric film widens at smaller distances to the lower electrode, an upper end of the second end face being substantially aligned with or located further in than the outer periphery of the air gap, the lower piezoelectric film having a region having a substantially uniform film thickness between an upper end of the first end face and a lower end of the second end face.

10. A multiplexer comprising:
a filter including a piezoelectric thin film resonator, wherein
the piezoelectric thin film resonator includes:
  a substrate;
  a lower electrode that is located on the substrate through an air gap;
  an upper electrode located on the lower electrode;
  a piezoelectric film that is located so as to have a resonance region where the lower electrode and the upper electrode face each other across at least a part of the piezoelectric film, and has a lower piezoelectric film located on the lower electrode and an upper piezoelectric film located between the lower piezoelectric film and the upper electrode, in an extraction region where the lower electrode is extracted from the resonance region, a lower end of a first end face of the lower piezoelectric film being substantially aligned with or located further out than an outer periphery of the air gap, a second end face of the upper piezoelectric film being inclined so that the upper piezoelectric film widens at smaller distances to the lower electrode, an upper end of the second end face being substantially aligned with or located further in than the outer periphery of the air gap, the lower piezoelectric film having a region having a substantially uniform film thickness between an upper end of the first end face and a lower end of the second end face.

* * * * *